United States Patent [19]

Noda et al.

[11] Patent Number: 4,716,385

[45] Date of Patent: Dec. 29, 1987

[54] MULTILEVEL MODULATOR COMPRISING A COMPACT ERROR CORRECTING CODE PRODUCING UNIT

[75] Inventors: Seiichi Noda; Makoto Yoshimoto, both of Tokyo, Japan

[73] Assignee: NEC Corporation, Japan

[21] Appl. No.: 889,804

[22] Filed: Jul. 23, 1986

[30] Foreign Application Priority Data

Jul. 24, 1985 [JP] Japan ............................... 60-164695
Aug. 23, 1985 [JP] Japan ............................... 60-184015

[51] Int. Cl.$^4$ ........................... H03K 7/00; H03K 9/00
[52] U.S. Cl. ..................................... 332/9 R; 332/17;
329/104; 329/109; 375/19; 375/39; 371/2
[58] Field of Search ............... 332/9 R, 16 R, 18, 17,
332/22, 23 R, 31 R, 37 R, 41, 42, 48; 329/50,
104, 109, 110, 122, 124, 135; 375/17, 19, 26, 34,
39, 58, 94, 118; 371/2

[56] References Cited

U.S. PATENT DOCUMENTS

4,529,950 7/1985 Chazenfus et al. ............... 332/18 X

Primary Examiner—Eugene R. LaRoche
Assistant Examiner—David Mis
Attorney, Agent, or Firm—Laff, Whitesel, Conte & Saret

[57] ABSTRACT

In a multilevel modulator for use in modulating an input digital signal of N levels into a multilevel modulated signal, the input digital signal is converted by a code converting unit into a major converted signal for the input digital signal and a minor converted signal corresponding to the major converted signal. The major converted signal is rearranged into groups each of which consists of a predetermined number of levels smaller than N and which is produced in a time division fashion together with with minor converted signal. A signal producing unit processes each group to produce a Lee-error correcting code sequence. Alternatively, major and minor converted signals are produced on quadrature-phase amplitude modulation of a circular signal arrangement of N-levels to divide the circular signal arrangement into a square signal arrangement and the remaining signal arrangement. In a counterpart multilevel demodulator, an inverse operation is carried out to reproduce the input digital signal.

9 Claims, 9 Drawing Figures

| $S_{11}'$ | $S_{21}'$ | $S_4$ of +1 | | $S_4$ of -1 | |
|---|---|---|---|---|---|
| | | $S_{10}'$ | $S_{20}'$ | $S_{10}'$ | $S_{20}'$ |
| 4 | 1 | 5 | 1 | (3) | (1) |
| 5 | 1 | 6 | 1 | 4 | 1 |
| 6 | 1 | 7 | 1 | 5 | 1 |
| 7 | 1 | 0 | 0 | 6 | 1 |
| 0 | 0 | 1 | 0 | 7 | 1 |
| 1 | 0 | 2 | 0 | 0 | 0 |
| 2 | 0 | 3 | 0 | 1 | 0 |
| 3 | 0 | 4 | 0 | 2 | 0 |
| 4 | 0 | 5 | 0 | 3 | 0 |
| 5 | 0 | 6 | 0 | 4 | 0 |
| 6 | 0 | 7 | 0 | 5 | 0 |
| 7 | 0 | 0 | 1 | 6 | 0 |
| 0 | 1 | 1 | 1 | 7 | 0 |
| 1 | 1 | 2 | 1 | 0 | 1 |
| 2 | 1 | 3 | 1 | 1 | 1 |
| 3 | 1 | (4) | (1) | 2 | 1 |

| $SP_{11}'$ | $SP_{21}'$ | $SP_3$ of $+1$ | | $SP_3$ of $-1$ | |
|---|---|---|---|---|---|
| | | $SP_{10}'$ | $SP_{20}'$ | $SP_{10}'$ | $SP_{20}'$ |
| 0 | 1 | — | — | 15 | 0 |
| 15 | 0 | 0 | 1 | 14 | 0 |
| 14 | 0 | 15 | 0 | 13 | 0 |
| 13 | 0 | 14 | 0 | 12 | 0 |
| 12 | 0 | 13 | 0 | 11 | 0 |
| 11 | 0 | 12 | 0 | 10 | 0 |
| 10 | 0 | 11 | 0 | 9 | 0 |
| 9 | 0 | 10 | 0 | 8 | 0 |
| 8 | 0 | 9 | 0 | 7 | 0 |
| 7 | 0 | 8 | 0 | 6 | 0 |
| 6 | 0 | 7 | 0 | 5 | 0 |
| 5 | 0 | 6 | 0 | 4 | 0 |
| 4 | 0 | 5 | 0 | 3 | 0 |
| 3 | 0 | 4 | 0 | 2 | 0 |
| 2 | 0 | 3 | 0 | 1 | 0 |
| 1 | 0 | 2 | 0 | 0 | 0 |
| 0 | 0 | 1 | 0 | 15 | 1 |
| 15 | 1 | 0 | 0 | — | — |

FIG. 9

MULTILEVEL MODULATOR COMPRISING A COMPACT ERROR CORRECTING CODE PRODUCING UNIT

BACKGROUND OF THE INVENTION

This invention relates to a multilevel modulator which has an error correcting code producing unit and to a multilevel demodulator for use as a counterpart of the modulator.

For the multilevel modulator of the type described, it is desirable that a modulating signal have an increased number of levels. This is because the increased number of levels makes it possible to effectively utilize a carrier level. Therefore, a large-capacity digital radio communication network ordinarily comprises the multilevel modulator. In such a digital radio communication network, a transmission error, namely, a code error, of transmission information is reduced by an error correcting system which makes use of an error correcting code. As the error correcting code, a Lee-error correcting code is well known in the art. The error correcting system is exemplified in an article contributed by Katsuhiro Nakamura of NEC Corporation, namely, the present assignee, to ICC Conference Record, Vol. 4-3 (June 1979), pages 45.4.1 to 45.4.5, under the title of "A Class of Error Correcting Codes for DPSK Channels."

With an increase in the modulating signal levels, the error correcting code requires an increased number of bits. Accordingly, the error correcting code producing unit must carry out a large amount of logical operation on producing the error correcting code. As a result, the error correcting code producing unit becomes bulky and expensive. This applies to the multilevel demodulator.

SUMMARY OF THE INVENTION

It is therefore an object of this invention to provide a multilevel modulator which comprises a compact error correcting code producing unit.

It is another object of this invention to provide a multilevel modulator which is suitable for high-speed operation.

It is a still further object of this invention to provide a multilevel demodulator for use as a counterpart of the multilevel modulator of the type described.

A multilevel modulator to which this invention is applicable, is for modulating a carrier signal into a multilevel modulated signal in response to an input digital signal having a plurality of levels. According to an aspect of this invention, the multilevel modulator comprises code converting means for converting the input digital signal into a major converted signal and a minor converted signal. The major converted signal has rearranged groups each of which consists of a first predetermined number of levels. The minor converted signal has a second predetermined number of levels related to the respective groups. The multilevel modulator further comprises signal producing means responsive to the major converted signal for producing a Lee-error correcting code sequence, multiplexing means for multiplexing the error correcting code sequence and the major converted signal into a major multiplexed signal and the error correcting code sequence and the minor converted signal into a minor multiplexed signal, and modulating means for modulating the carrier signal by the major and the minor multiplexed signals into the multilevel modulated signal.

A multilevel demodulator to which this invention is applicable, is for demodulating a multilevel modulated signal into which a modulator carrier signal is modulated by a modulating signal which is converted from an input digital signal and which comprises an error correcting code sequence. According to another aspect of this invention, the demodulator comprises demodulating means responsive to a local carrier signal for demodulating the multilevel modulated signal into a major demodulated signal and a minor demodulated signal. The major demodulated signal has rearranged groups, each of which consists of a first predetermined number of levels. The minor demodulated signal has a second predetermined number of levels related to the respective groups. The demodulator further comprises signal producing means responsive to the major demodulated signal for producing an error correcting signal, error correcting means for correcting the major demodulated signal and the minor demodulated signal with reference to the error correcting signal to produce a major correction result signal and a minor correction result signal, respectively, and code converting means for converting the major correction result signal and the minor correction result signal into a reproduction of the input digital signal.

DESCRIPTION OF THE PREFERRED EMBODIMENTS

Figure 1:
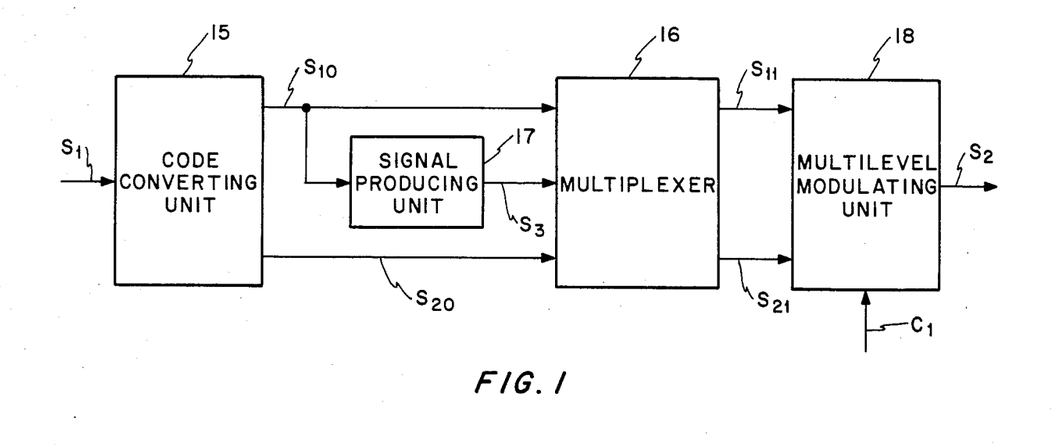
FIG. 1 is a block diagram of a multilevel modulator according to a first embodiment of this invention.

Referring to FIG. 1, a multilevel modulator according to a first embodiment of this invention is for use in modulating an input digital signal $S_1$ into a multilevel modulated signal $S_2$. The multilevel modulator comprises a code converting unit 15 supplied with the input digital signal $S_1$. The input digital signal $S_1$ is capable of representing at most N levels where N is represented by $(i \cdot 2^n + m)$ where, in turn, n is an integer which is not smaller than two, m and i are integers which satisfy $0 \leq m \leq 2^n$ and $(m+i) \geq 2$, respectively. The code converting unit 15 is for converting the input digital signal $S_1$ to a major converted signal $S_{10}$ of $2^n$ levels and a minor converted signal $S_{20}$ which has $(i+k)$ levels where k is equal to zero and one when m is equal to zero and is greater than zero, respectively.

When the input digital signal $S_1$ is a four-bit binary digital signal, it is capable of representing at most sixteen levels $(=2^4)$. The code converting unit 15 converts the input digital signal $S_1$ to the major converted signal $S_{10}$ of eight levels $(=2^3)$ and the minor converted signal $S_{20}$ of two levels $(=2^1)$. In other words, the code converting unit 15 rearranges the levels of the input digital signal $S_1$ as will later be described in detail. It is understood under the circumstances that n, m, i, and k are equal to three, zero, two, and zero, respectively.

The major converted signal $S_{10}$ is divided into two parts one of which is delivered to a multiplexer 16. The other part is supplied to a signal producing unit 17. Responsive to the major converted signal $S_{10}$, the signal producing unit 17 produces a single Lee-error correcting code sequence $S_3$ in the manner described in the conference record cited hereinabove. The multiplexer 16 multiplexes the error correcting signal $S_3$ and the major converted signal $S_{10}$ into a major multiplexed signal $S_{11}$ and the error correcting signal $S_3$ and the minor converted signals $S_{20}$ into a minor multiplexed signal $S_{21}$.

A multilevel modulating unit 18 has a code converting function which is complementary to the code conversion of the code converting unit 15. Accordingly, the modulating unit 18 converts the major multiplexed signal $S_{11}$ and the minor multiplexed signal $S_{21}$ to a multilevel signal having sixteen levels. Furthermore, the modulating unit 18 modulates a carrier signal $C_1$ by the multilevel signal and produces the multilevel modulated signal $S_2$ of sixteen levels. The multilevel modulated signal $S_2$ is transmitted to a multilevel demodulator through a transmission medium.

Figure 2:
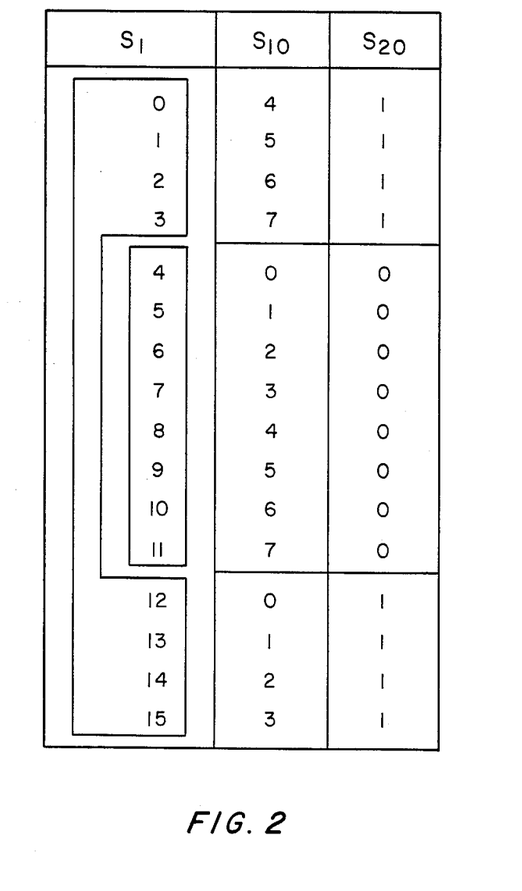
FIG. 2 is a diagram for use in describing operation of a code converting unit of the modulator illustrated in FIG. 1.

Referring to FIG. 2, description will be made as regards the code conversion in the code converting unit 15. In the manner exemplified above, it will be assumed that the input digital signal $S_1$ is capable of having one of zeroth through fifteenth levels 0 to 15. The major and the minor converted signals have zeroth through seventh levels 0 to 7 and zeroth and first levels 0 and 1, respectively.

The code converting unit 15 converts the zeroth to the third levels 0 to 3 and the twelfth to the fifteenth levels 12 to 15 of the input digital signal $S_1$ into the major converted signal $S_{10}$ of the fourth to the seventh levels 4 to 7 and the zeroth to the third levels 0 to 3, respectively. The code converting unit 15 further converts the fourth to the eleventh levels 4 to 11 of the input digital signal $S_1$ into the major converted signal $S_{10}$ of the zeroth to the seventh levels 0 to 7. In other words, the input digital signal $S_1$ of sixteen levels 0 to 15 is rearranged in the major converted signal $S_{10}$ by the code converting unit 15 into first and second groups, each of which consists of eight levels 0 to 7. Alternatively, the code converting unit 15 may convert the zeroth to the seventh levels 0 to 7 of the input digital signal $S_1$ into the major converted signal $S_{10}$ of the zeroth to the seventh levels 0 to 7 and the eighth to the fifteenth levels 8 to 15 also to the major converted signal $S_{10}$ of the zeroth through the seventh levels 0 to 7.

As shown in FIG. 2, the first group serves to specify eight levels consisting of zeroth through third levels and twelfth through fifteenth levels while the second group serves to specify eight levels consisting of fifth through eleventh levels. In the example being illustrated, $(i+k)$ is equal to two as mentioned before and can determine the number of groups of the major converted signal $S_{10}$. Accordingly, the major converted signal $S_{10}$ exemplified in FIG. 1 is rearranged into two groups.

The minor converted signal $S_{20}$ has two levels in correspondence to the two groups of the major converted signal $S_{10}$. The code converting unit 15 produces the minor converted signal $S_{20}$ of the zeroth level "0" together with the major converted signal $S_{10}$ when the input digital signal $S_1$ takes one of the fourth to the eleventh levels 4 to 11. The code converting unit 15 produces the minor converted signal $S_{20}$ of the first level "1" when the input digital signal $S_1$ takes one of the zeroth to the third levels 0 to 3 and the twelfth to the fifteenth levels 12 to 15. Thus, the input digital signal $S_1$ of sixteen levels is converted into the major converted signal $S_{10}$ of eight levels and the minor converted signal $S_{20}$ which has two levels.

Referring back to FIG. 1, the signal producing unit 17 carries out a predetermined operation on the major converted signal $S_{10}$. The predetermined operation is for producing the single Lee-error correcting code sequence $S_3$. The exemplified single Lee-error correcting code sequence is suitable for correcting a single Lee-error such that a change of either "+1" or "−1" takes place in a data signal of eight levels. Such a change of either "+1" or "−1" can be corrected by adding either "−1" or "+1" modulo 8 to the data signal. This is similar to a double Lee-error correcting code sequence, if the signal producing unit 17 produces the double Lee-error correcting code sequence. In this event, such a double Lee-error can be corrected by adding either "+2" or "−2" modulo 8 to the data signal.

Code correction of the single and the double Lee-error correcting code sequences is described in the conference record cited before and has no direct concern with the present invention. Therefore, no description will be made as regards the Lee-error correcting code sequence and the signal producing unit 17 any longer.

It may, however, be pointed out that the signal producing unit 17 processes the major converted signal $S_{10}$ of eight levels rather than directly the input digital signals $S_1$ of sixteen levels. Therefore, the signal producing unit 17 is operable with a reduced amount of logical operation. The signal producing unit 17 is compact and can carry out the logical operation at high speed.

Figure 3:
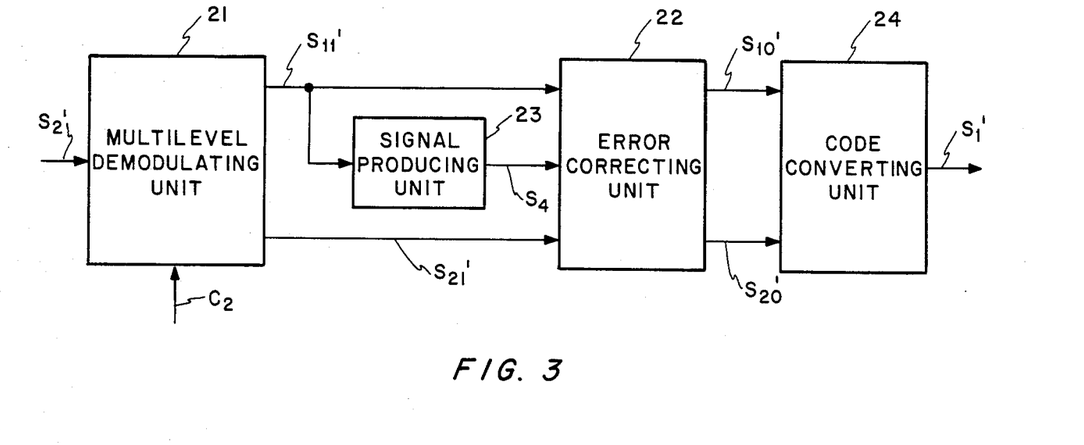
FIG. 3 is a block diagram of a multilevel demodulator for use as a counterpart of the multilevel modulator illustrated in FIG. 1.

Referring to FIG. 3, a multilevel demodulator is for use as a counterpart of the multilevel modulator illustrated with reference to FIG. 1. The multilevel demodulator is supplied as a demodulator input signal with a multilevel modulated signal which is identical with that illustrated in FIG. 1 as long as no transmission or code error takes place and which is indicated at $S_2'$. Responsive to the multilevel modulated signal $S_2'$ and a local carrier signal $C_2$, a demodulating unit 21 carries out multilevel demodulation of the multilevel modulated signal $S_2'$ and code conversion which is complementary to the code conversion in the modulating unit 18 (FIG. 1). As a result, the demodulating unit 21 delivers a major demodulated signal $S_{11}'$ and a minor demodulated signal $S_{21}'$ to an error correcting unit 22. If the multilevel modulated signal $S_2'$ is free from the transmission error, the major demodulated signal $S_{11}'$ and the minor demodulated signal $S_{21}'$ are reproductions of the major multiplexed signal $S_{11}$ and the minor multiplexed signal $S_{21}$, respectively.

The major demodulated signal $S_{11}'$ is divided into two parts, one of which is supplied to the error correcting unit 22. The other part is fed to a signal producing unit 23. The signal producing unit 23 successively deals with each major demodulated signal $S_{11}'$ as the data signal of eight levels ("0" to "7") to detect the single Lee-error. The signal producing unit 23 thereby produces an error correcting signal $S_4$ on detection of the single Lee-error. The error correcting signal $S_4$ takes either "+1" or "−1" at a position of the major demodulated signal $S_{11}'$ at which such a single Lee-error occurs. The signal producing unit 23 is also described in detail in the above-referenced conference record and will not be described any longer.

The illustrated error correcting unit 22 corrects at least the single Lee-error of the major demodulated signal $S_{11}'$ and the minor demodulated signal $S_{21}'$ with reference to the error correcting signal $S_4$ as will later be described in detail. The error correcting unit 22 produces a major correction result signal $S_{10}'$ and a minor correction result signal $S_{20}'$. If the major demodulated signal $S_{11}'$ is free from the code error, the error correcting unit 22 produces the major demodulated signal $S_{11}'$ and the minor demodulated signal $S_{21}'$ as they stand. Otherwise, the error correcting unit 22 produces error corrected signals. At any rate, the error correcting unit 22 sends major and minor correction result signals $S_{10}'$ and $S_{20}'$ to a code converting unit 24.

The code converting unit 24 carries out code conversion complementary to the code conversion of the code converting unit 15 (FIG. 1) and converts the major correction result signal $S_{10}'$ and the minor correction result signal $S_{20}'$ to produce an output digital signal $S_1'$ of sixteen levels as a reproduction of the input digital signal $S_1$ (FIG. 1).

Figure 4:
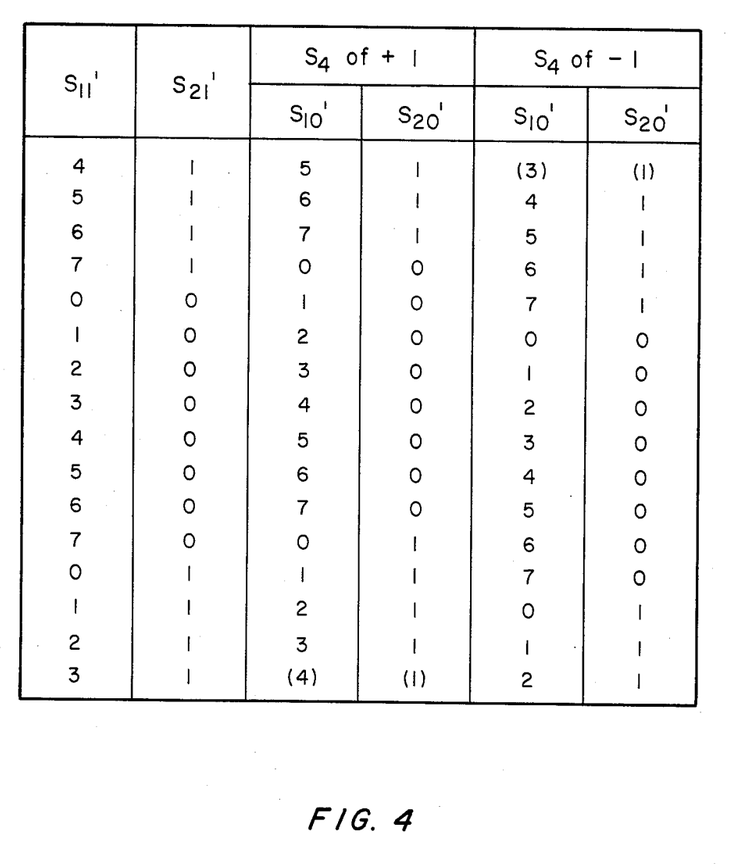
FIG. 4 is a diagram for use in describing operation of an error correcting unit of the demodulator illustrated in FIG. 3.

Referring to FIG. 4, description will be made as regards the error correction in the error correcting unit 22. The major demodulated signal $S_{11}'$ has two rearranged groups, each of which specifies eight levels. The minor demodulated signal $S_{21}'$ has two levels in correspondence to the two groups of the major demodulated signal $S_{11}'$. The error correcting unit 22, for example, converts the major demodulated signal $S_{11}'$ of the fourth level 4 to the major correction result signal $S_{10}'$ of the fifth level 5 when the error correcting unit 22 is supplied with the error correcting signal $S_4$ of "+1." Generally speaking, the error correcting unit 22 produces the major correction result signal $S_{10}'$ of a level which is equal to one plus the level of the major demodulated signal $S_{11}'$ even when the error correcting unit 22 is supplied with the error correcting signal $S_4$ of "+1." To the contrary, the error correcting unit 22 produces the major correction result signal $S_{10}'$ of another level which is equal to the level of the major demodulated signal $S_{11}'$ minus one whenever the error correcting unit 22 is supplied with the error correcting signal $S_4$ of "−1." In this manner, the error correcting unit 22 corrects the single Lee-error of the major demodulated signal $S_{11}'$ and the minor demodulated signal $S_{21}'$ as shown in FIG. 4. If the multilevel modulation is carried out either by amplitude modulation or frequency modulation, specific levels of the major and the minor demodulated signals $S_{11}'$ and $S_{21}'$ are excepted from the error correction. Each of the specific level is enclosed with parentheses in FIG. 4.

With regard to the minor demodulated signal $S_{21}'$, the error correcting unit 22 inverts the levels of the first minor demodulated signal $S_{21}'$ on error correcting the seventh level of the major demodulated signal $S_{11}'$ whenever the error correcting unit 22 is supplied with the error correcting signal $S_4$ of "+1." The error correcting unit 22 further inverts the levels of the minor demodulated signal $S_{21}'$ on error correcting the zeroth level of the major demodulated signal $S_{11}'$ whenever the error correcting unit 22 is supplied with the error correcting signal $S_4$ of "−1."

In the meanwhile, the signal producing unit 23 does not discriminate the two rearranged groups of the major demodulated signal $S_{11}'$. This might bring about occurrence of any error such that the minor multiplexed signal $S_{21}$ alone is erroneously demodulated into the minor demodulated signal $S_{21}'$ despite the fact that the major multiplexed signal $S_{11}$ is correctly reproduced into the major demodulated signal $S_{11}'$. But, such a code error occurs in a very low probability so far as the Lee-error correcting code sequence is used as the multilevel modulated signal. Therefore, the above-exemplified code error can be disregarded.

From this fact, it is seen that the signal producing unit 23 may logically process the major demodulated signal $S_{11}'$ of eight levels. Such logical processing may need only three ($=\log_2 8$) logical steps which are reduced in number in comparison with four ($=\log_2 16$) logical steps necessary for processing the multilevel modulated signal $S_2'$ of sixteen levels. Accordingly, the signal producing unit 23 may be small in size and can carry out logical operation at high speed.

Figure 5:
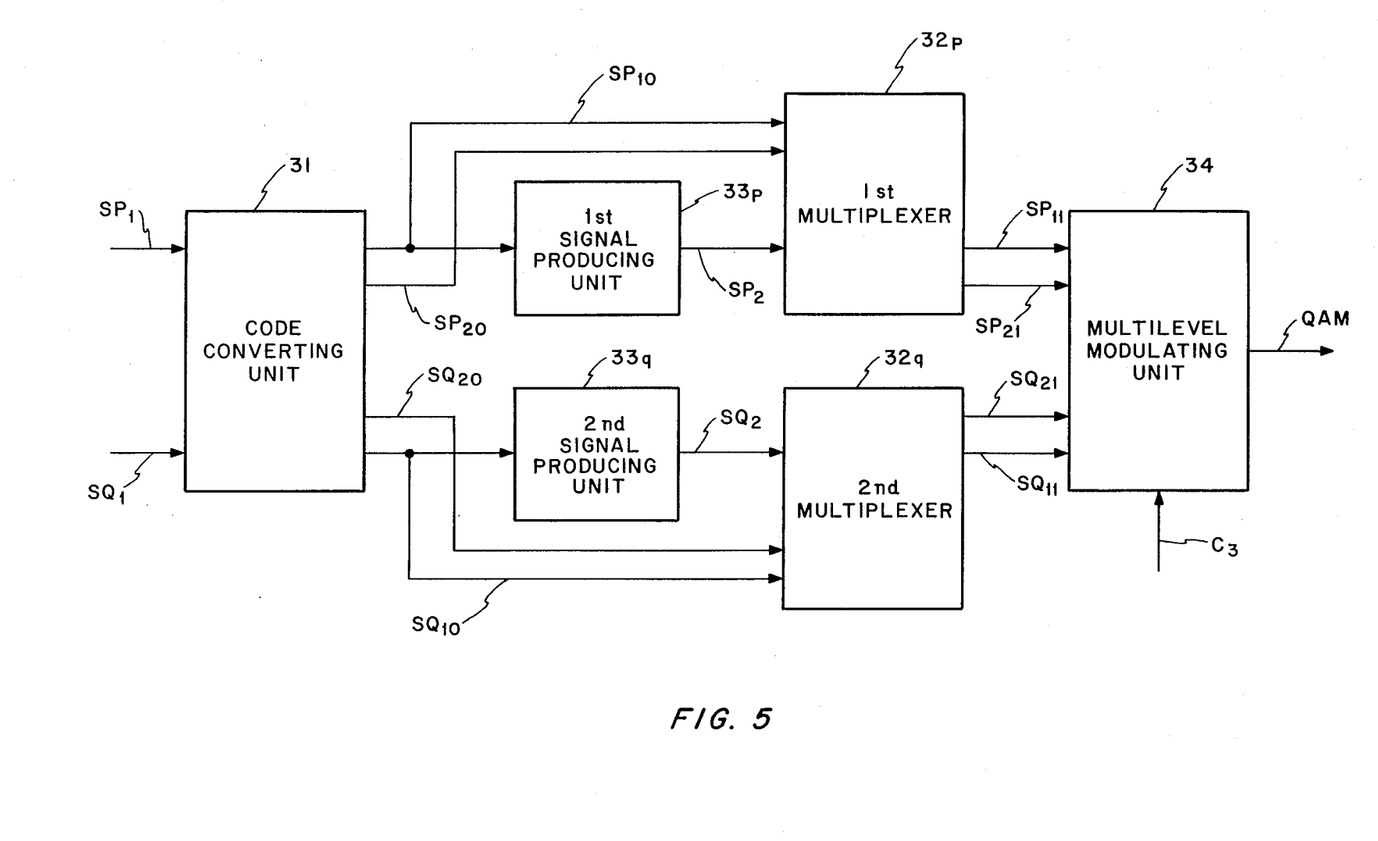
FIG. 5 is a block diagram of a multilevel quadrature-phase amplitude modulator which is a multilevel modulator according to a second embodiment of this invention.

Referring to FIG. 5, a modulator according to a second embodiment of this invention is for use in a sixteen-level quadrature-phase amplitude modulation. The modulator modulates a first input digital signal $SP_1$ of a channel P and a second input digital signal $SQ_1$ of another channel Q into a quadrature-phase amplitude modulated signal QAM.

The modulator comprises a code converting unit 31 supplied with the first and the second input digital signals $SP_1$ and $SQ_1$. Each of the first and the second input digital signals $SP_1$ and $SQ_1$ is capable of representing at most N levels where N is equal to $2^x$ where, in turn, x is an integer which is not less than four. The code converting unit 31 is for converting the first input digital signal $SP_1$ to first major and first minor converted signals $SP_{10}$ and $SP_{20}$ and the second input digital signal $SQ_1$ to second major and second minor converted signals $SQ_{10}$ and $SQ_{20}$, respectively. Each of the first and the second major converted signals $SP_{10}$ and $SQ_{10}$ has $2^x$ levels. Each of the first and the second minor converted signals $SP_{20}$ and $SQ_{20}$ has $2y$ levels where y represents a positive integer.

Each of the first and the second input digital signals $SP_1$ and $SQ_1$ may be a four-bit binary digital signal and capable of representing at most sixteen levels ($=2^4$). Accordingly, each of the first and the second major converted signals $SP_{10}$ and $SQ_{10}$ has sixteen levels ($=2^4$). On the other hand, each of the first and the second minor converted signals $SP_{20}$ and $SQ_{20}$ has two levels ($=2^1$). Under the circumstances, a combination of the first and the second input digital signals $SP_1$ and $SQ_1$ can represent 256 different values. The 256 different values are produced as the quadrature-phase amplitude modulated signal QAM.

Figure 6:
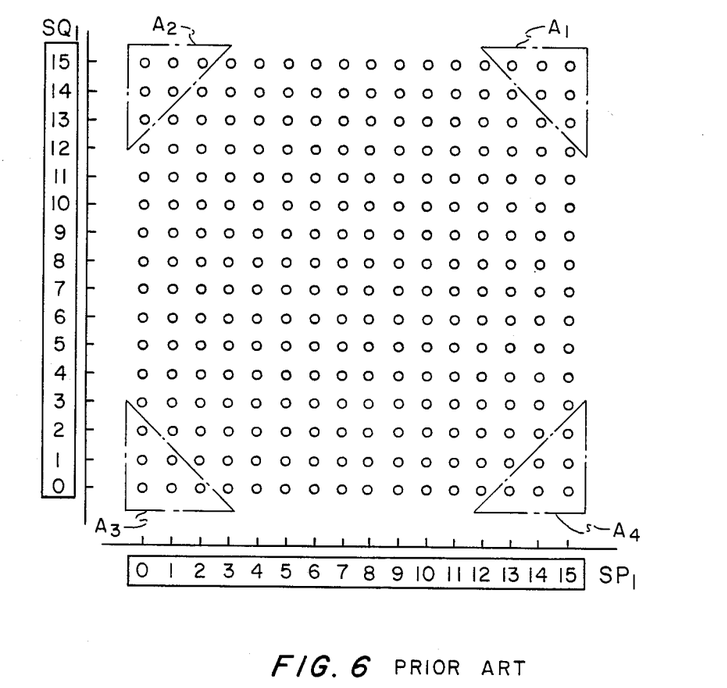
FIG. 6 shows a signal point distribution of a conventional multilevel quadrature-phase amplitude modulated signal.

Referring to FIG. 6, the 256 different values are depicted as 256 signal points on a phase plane of the quadrature-phase amplitude modulated signal QAM. When distributed on the phase plane in a usual manner, the 256 signal points form a square on the phase plane.

Figure 7:
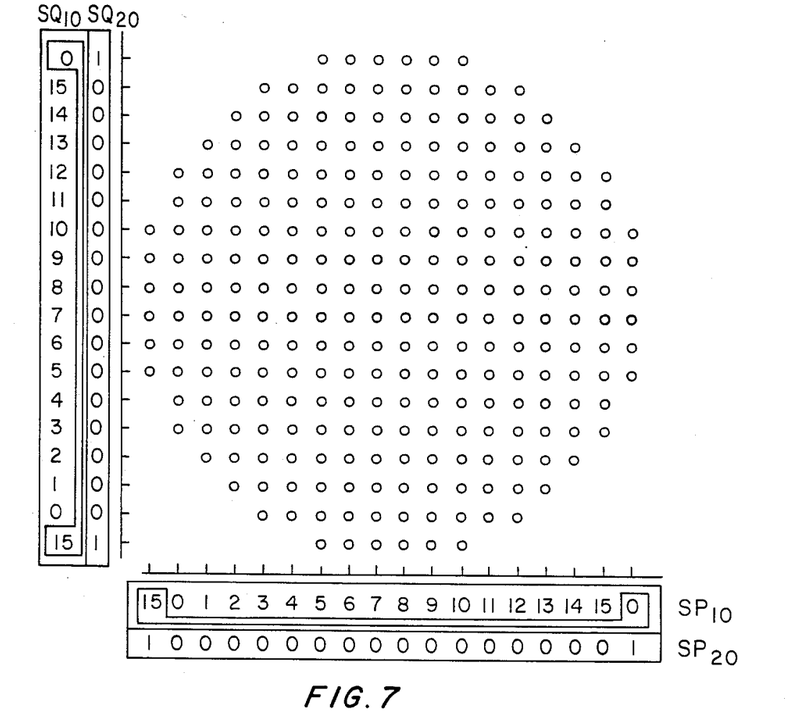
FIG. 7 shows a signal point distribution of a quadrature-phase amplitude modulated signal produced by the multilevel quadrature-phase amplitude modulator illustrated in FIG. 5.

Turning to FIG. 7, the code converting unit 31 (FIG. 5) is for arranging the 256 signal points into a nearly circular shape on the phase plane. In order to derive the nearly circular signal arrangement, twenty-four signal points in first to fourth corners $A_1$ to $A_4$ (FIG. 6) of the square are displaced to four sides of the square in the manner which will be described in the following.

Comparison of FIGS. 5 and 7 will show that the first input digital signal $SP_1$ is rearranged in the first major converted signal $SP_{10}$ by the code converting unit 31 into a first and a second rearranged group. The first rearranged group consists of zeroth to fifteenth levels 0 to 15. The second rearranged group consists of zeroth level 0 and fifteenth level 15. Similarly, the second input digital signal $SQ_1$ is rearranged in the second major converted signal $SQ_{10}$ into two groups which will again be called a first and a second rearranged group. The first rearranged group consists of zeroth to fifteenth levels 0 to 15. The second rearranged group consists of zeroth level 0 and fifteenth level 15. Such code conversion is exemplified in U.S. patent application Ser. No. 779,217 filed Sept. 23, 1985 by Junichi Uchibori et al for assignment to NEC Corporation and have no direct concern with the present invention. Therefore, no description will be made about the code converting unit 31 any longer.

In FIG. 5, the first major converted signal $SP_{10}$ is divided into two parts one of which is delivered to a first multiplexer 32p. The other part is supplied to a first signal producing unit 33p. Responsive to the first major converted signal $SP_{10}$, the first signal producing unit 33p produces a first single Lee-error correcting code sequence $SP_2$ in the manner described in connection with the signal producing unit 17 (FIG. 1). The first multiplexer 32p multiplexes the first single Lee-error correcting code sequence $SP_2$ and the first major converted signal $SP_{10}$ into a first major multiplexed signal $SP_{11}$ and the first single Lee-error correcting code sequence $SP_2$ and the first minor converted signal $SP_{20}$ into a first minor multiplexed signal $SP_{21}$.

Similarly, a second multiplexer 32q is supplied with the second major converted signal $SQ_{10}$ and a second single Lee-error correcting code sequence $SQ_2$ which is produced by a signal producing unit 33q in response to the second major converted signal $SQ_{10}$. The second multiplexer 32q multiplexes the second single Lee-error correcting signal $SQ_2$ and the second major converted signal $SQ_{10}$ into a second major multiplexed signal $SQ_{11}$ and the second single Lee-error correcting signal $SQ_2$ and the second minor converted signal $SQ_{20}$ into a second minor multiplexed signal $SQ_{21}$.

Responsive to the first major and the first minor multiplexed signals $SP_{11}$ and $SP_{21}$ and the second major and the second minor multiplexed signals $SQ_{11}$ and $SQ_{21}$, a multilevel modulating unit 34 modulates a pair of quadrature-phase carrier signals $C_3$ into the multilevel quadrature-phase amplitude modulated signal QAM. The multilevel quadrature-phase amplitude modulated signal QAM is transmitted to a multilevel quadrature-phase amplitude demodulator through a transmission medium. It is readily understood that the first and the second signal producing units 33p and 33q may produce a double Lee-error correcting code sequence as described in FIG. 1.

As mentioned above, the first major converted signal $SP_{10}$ is divided into the first group of sixteen levels and the second group of two levels placed outside of the sixteen levels and is subjected to error correction by the use of the first signal producing unit 33p for carrying out a logical operation of the sixteen levels. This is because the Lee-error correcting code sequence is used as the first major converted signal $SP_{10}$.

A conventional thought is that an error correcting code producing unit for thirty-two levels is indispensable for correcting such a first major converted signal of eighteen levels. From this fact, it is readily understood that the first signal producing unit 33p is small in size and operable at a high speed in comparison with the conventional error correcting code producing unit.

This applies to the second signal producing unit 33q, although the above-mentioned description is restricted to the first signal producing unit 33p.

Figure 8:
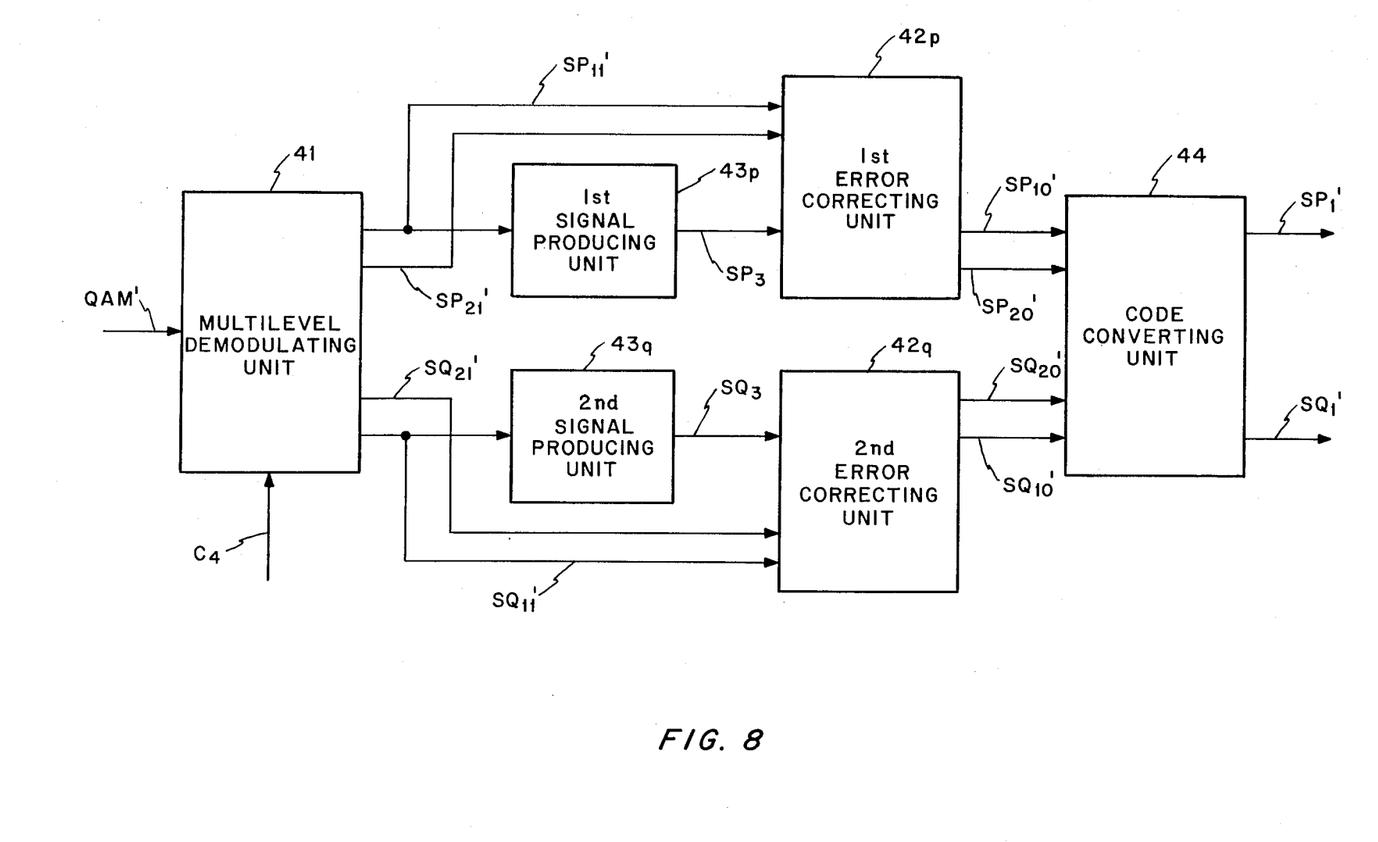
FIG. 8 is a block diagram of a multilevel quadrature-phase amplitude demodulator for use as a counterpart of the multilevel quadrature-phase amplitude modulator illustrated in FIG. 5.

Referring to FIG. 8, a multilevel quadrature-phase amplitude demodulator is for use as a counterpart of the sixteen-level quadrature-phase amplitude modulator illustrated with reference to FIG. 5. The demodulator is for demodulating the multilevel modulated signal illustrated with reference to FIG. 7. The demodulator comprises a multilevel demodulating unit 41 supplied with the multilevel quadrature-phase amplitude modulated signal indicated at QAM'. Responsive to a pair of quadrature-phase local carrier signals $C_4$, the demodulating unit 41 demodulates the multilevel quadrature-phase amplitude modulated signal QAM' into first major and first minor demodulated signals $SP_{11}'$ and $SP_{21}'$ of the channel P and second major and second minor demodulated signals $SQ_{11}'$ and $SQ_{21}'$ of the other channel Q. The first major demodulated signal $SP_{11}'$ is divided into two parts, one of which is delivered to a first error correcting unit 42p. The other part is supplied to a first signal producing unit 43p. Responsive to the first major demodulated signal $SP_{11}'$, the first signal producing unit 43p produces a first error correcting signal $SP_3$ on detection of the single Lee-error in the manner described in conjunction with the signal producing unit 23 (FIG. 3).

The second major demodulated signal $SQ_{11}'$ is divided into two parts, one of which is delivered to a second error correcting unit 42q. The other part is supplied to a second signal producing unit 43q. Responsive to the second major demodulated signal $SQ_{11}'$, the second signal producing unit 43q produces a second error correcting signal $SQ_3$ on detection of the single Lee-error.

The first error correcting unit 42p corrects the single Lee-error of the first major demodulated signal $SP_{11}'$ and the first minor demodulated signal $SP_{21}'$ with reference to the first error correcting signal $SP_3$ as will later be described in detail. The first error correcting unit 42p produces a first major correction result signal $SP_{10}'$ and a first minor correction result signal $SP_{20}'$ to a code converting unit 44. On the other hand, the second error correcting unit 42q produces a first major correction result signal $SQ_{10}'$ and a second minor correction result signal $SQ_{20}'$ to the code converting unit 44.

The code converting unit 44 carries out code conversion which is complementary to the code conversion of the code converting unit 31 (FIG. 5). The code converting unit 44 converts the first major correction result signal $S_{10}'$ and the first minor correction result signal $S_{20}'$ to produce a first output digital signal $SP_1'$ of sixteen levels as a reproduction of the first input digital signal $SP_1$ (FIG. 5). The code converting unit 44 further converts the second major correction result signal $SQ_{10}'$ and the second minor correction result signal $SQ_{20}'$ to produce a second output digital signal $SQ_1'$ of sixteen levels as a reproduction of the second input digital signal $SQ_1$ (FIG. 5).

Figure 9:
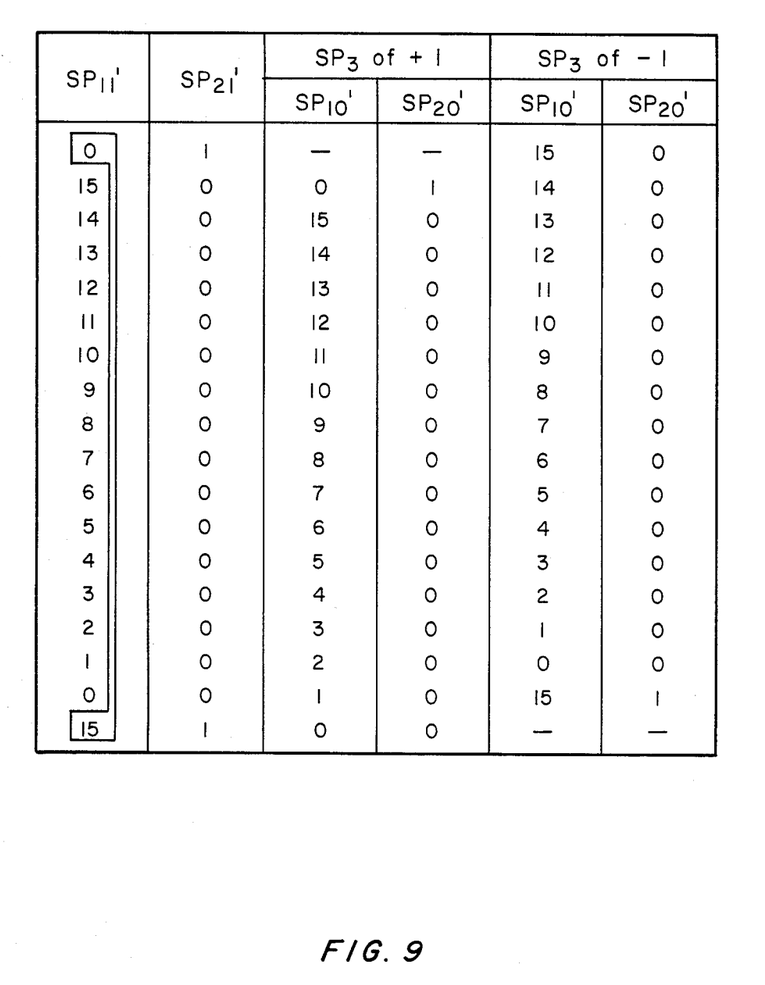
FIG. 9 is a diagram for use in describing error correcting operation of an error correcting unit of the demodulator illustrated in FIG. 8.

Referring to FIG. 9, description will be made as regards the error correction in the first error correcting unit 42p. Although restricted to the first error correcting unit 42p, the description applies to the second error correcting unit 42q. The first major demodulated signal $SP_{11}'$ has first and second rearranged groups. The first rearranged group consists of zeroth to fifteenth levels 0 to 15. The second rearranged group consists of zeroth level 0 and fifteenth level 15. The first error correcting unit 42p produces the first major correction result signal $SP_{10}'$ of a level which is equal to one plus the level of the first major demodulated signal $SP_{11}'$ whenever the first error correcting unit 42p is supplied with the first error correcting signal $SP_3$ of "+1." To the contrary, the first error correcting unit 42p produces the first major correction result signal $SP_{10}'$ of another level which is equal to the level of the first major demodulated signal $SP_{11}'$ minus one whenever the first error correcting unit 42p is supplied with the first error correcting signal $SP_3$ of "+1." In this manner, the first error correcting unit 42p corrects the single Lee-error of the first major demodulated signal $SP_{11}'$ as shown in FIG. 9. With regard to the first minor demodulated signal $SP_{21}'$, the first error correcting unit 42p inverts the level of the first minor demodulated signal $SP_{21}'$ on error correcting the fifteenth level of the first major demodulated signal $SP_{11}'$ whenever the first error correcting unit 42p is supplied with the first error correcting signal $SP_3$ of "+1.". The first error correcting unit 42p inverts the level of the first minor demodulated signal $SP_{21}'$ on error correcting the zeroth level of the first major demodulated signal $SP_{11}'$ whenever the first error correcting unit 42p is supplied with the first error correcting signal $SP_3$ of "−1."

In the meanwhile, the first signal producing unit 43p does not discriminate the two rearranged groups of the first major demodulated signal $SP_{11}'$. This might bring about occurrence of any error such that the first minor multiplexed signal $SP_{21}$ alone is erroneously demodulated into the minor demodulated signal $SP_{21}'$ despite the fact that the first major multiplexed signal $SP_{11}$ is correctly reproduced into the first major demodulated signal $SP_{11}'$. But, such a code error can be disregarded for the reasons described in conjunction with FIGS. 3 and 4.

As mentioned above, the first major demodulated signal $SP_{11}'$ is divided into the first rearranged group of sixteen levels and the second rearranged group of two levels placed outside of the sixteen levels. The first signal producing unit 43p carries out a logical operation for detecting the Lee-error of the first major demodulated signal $SP_{11}'$ of the sixteen levels. It is readily understood that the first signal producing unit 43p is small in size and operable at a high speed for the reasons described in connection with the first signal producing unit 33p illustrated in FIG. 5. This applies to the second signal producing unit 43q.

While this invention has thus far been described in conjunction with two preferred embodiments thereof, it will readily be possible for those skilled in the art to put this invention into practice in various other manners. For example, the number N may be 32 or 64. The major converted signal may be rearranged into three or more groups. The minor converted signal has three levels in correspondence to the respective groups when the major converted signal is rearranged into three groups.

What is claimed is:

1. A multilevel modulator responsive to an input digital signal having a plurality of levels for modulating a carrier signal into a multilevel modulated signal, wherein the improvement comprises:

code converting means for converting said input digital signal into a major converted signal and a minor converted signal, said major converted signal having rearranged groups, each group consisting of a first predetermined number of levels, said minor converted signal having a second predetermined number of levels related to the respective groups;

signal producing means responsive to said major converted signal for producing a Lee-error correcting code sequence;

multiplexing means for multiplexing said error correcting code sequence and said major converted signal into a major multiplexed signal and said error correcting code sequence and said minor converted signal into a minor multiplexed signal; and modulating means for modulating said carrier signal by said major and said minor multiplexed signals into said multilevel modulated signal.

2. A multilevel modulator as claimed in claim 1, wherein said input digital signal is capable of reproducing at most N levels where N is represented by $(i \cdot 2^n + m)$ where, in turn, n is an integer which is not smaller than two, m and i being integers which satisfy $0 \leq m < 2^n$ and $(m+i) \geq 2$, respectively, said first predetermined number being equal to $2^n$, said second predetermined number being equal to $(i+k)$ where k is equal to zero and one when m is equal to zero and is greater than zero, respectively.

3. A multilevel modulator as claimed in claim 1, wherein said modulating means is for carrying out one of an amplitude modulation, a frequency modulation, and a phase modulation.

4. A multilevel quadrature-phase amplitude modulator responsive to a first and a second input digital signal for modulating a pair of quadrature-phase carrier signals into a multilevel quadrature-phase amplitude modulated signal, each of said first and said second input digital signals being capable of representing at most N levels where N is equal to $2^x$ where, in turn, x represents an integer which is not less than four, wherein the improvement comprises:

code converting means for converting said first input digital signal to a first major and a first minor converted signal and said second input digital signal to a second major and a second minor converted signal, each of said first and said second major converted signals having a first rearranged group of a first predetermined number of levels and a second rearranged group of a second predetermined number of levels, each of said first and said second minor converted signals having a third predetermined number of levels related to said first and said second rearranged groups, respectively;

first and second signal producing means responsive to said first and said second major converted signals for producing a first and a second Lee-error correcting code sequence, respectively;

first multiplexing means for multiplexing said first error correcting code sequence and said first major converted signal into a first major multiplexed signal and said first error correcting code sequence and said first minor converted signal into a first minor multiplexed signal;

second multiplexing means for multiplexing said second error correcting code sequence and said second major converted signal into a second major multiplexed signal and said second error correcting code sequence and said second minor converted signal into a second minor multiplexed signal; and modulating means for modulating said pair of quadrature-phase carrier signals by said first major and said first minor multiplexed signals and said second major and said second minor multiplexed signals into said multilevel quadrature-phase amplitude modulated signal.

5. A multilevel quadrature-phase amplitude modulator as claimed in claim 4, wherein said first predetermined number is equal to N, said second predetermined number being equal to 2y where y represents a positive integer, said third predetermined number being equal to $(y+1)$.

6. A multilevel demodulator for demodulating a multilevel modulated signal into which a modulator carrier signal is modulated by a modulating signal which is converted from an input digital signal and which comprises a Lee-error correcting code sequence, said input digital signal having a plurality of levels, wherein the improvement comprises:

demodulating means responsive to a local carrier signal for demodulating said multilevel modulated signal into a major demodulated signal and a minor demodulated signal, said major demodulated signal having rearranged groups, each group consisting of a first predetermined number of levels, said minor demodulated signal having a second predetermined number of levels related to the respective groups;

signal producing means responsive to said major demodulated signal for producing an error correcting signal;

error correcting means for correcting said major demodulated signal and said minor demodulated signal with reference to said error correcting signal to produce a major correction result signal and a minor correction result signal, respectively; and code converting means for converting said major correction result signal and said minor correction result signal into a reproduction of said input digital signal.

7. A multilevel demodulator as claimed in claim 6, wherein said input digital signal is capable of representing at most N levels where N is represented by $(i \cdot 2^n + m)$ where, in turn, n is an integer which is not smaller than two, m and i being integers which satisfy $0 \leq m < 2^n$ and $(m+i) \geq 2$, respectively, said first predetermined number being equal to $2^n$, said second predetermined number being equal to $(i+k)$ where k is equal to zero and one when m is equal to zero and is greater than zero, respectively.

8. A multilevel quadrature-phase amplitude demodulator for demodulating a multilevel quadrature-phase amplitude modulated signal into which a pair of quadrature-phase modulator carrier signals are modulated by a first and a second modulating signal, with said first and said second modulating signals converted from a first and a second input digital signal, respectively, said first and said second modulating signals comprising a first and a second Lee-error correcting code sequence, respectively, each of said first and said second input digital signals being capable of representing at most N levels where N is equal to $2^x$ where, in turn, x represents an integer which is not less than four, wherein the improvement comprises:

demodulating means responsive to a pair of quadrature-phase local carrier signals for amplitude demodulating said multilevel quadrature-phase amplitude modulated signal into a first major and a first minor demodulated signal and a second major and a second minor demodulated signal, each of said first and said second major demodulated signals having a first rearranged group of a first predetermined number of levels and a second rearranged group of a second predetermined number of levels, each of said first and said second minor demodulated signals having a third predetermined number of levels related to said first and said second rearranged groups, respectively;

first signal producing means responsive to said first major demodulated signal for producing a first error correcting signal;

second signal producing means responsive to said second major demodulated signal for producing a second error correcting signal;

first error correcting means for correcting said first major and said first minor demodulated signals with reference to said first error correcting signal to produce a first major correction result signal and a first minor correction result signal, respectively;

second error correcting means for correcting said second major and said second minor demodulated signals with reference to said second error correcting signal to produce a second major correction result signal and a second minor correction result signal, respectively; and code converting means for converting said first major and said first minor correction result signals and said second major and said second minor correction result signals into a first and a second output digital signal as reproductions of said first and said second input digital signals.

9. A multilevel quadrature-phase amplitude demodulator as claimed in claim 8, wherein said first predetermined number is equal to N, said second predetermined number being equal to 2y where y represents a positive integer, said third predetermined number being equal to $(y+1)$.

* * * * *